United States Patent [19]

Mahler

[11] Patent Number: 5,126,593
[45] Date of Patent: Jun. 30, 1992

[54] METHOD AND CIRCUITRY FOR REDUCING OUTPUT TRANSIENTS RESULTING FROM INTERNAL GROUND INSTABILITIES

[75] Inventor: Theodor W. Mahler, Sherman, Tex.

[73] Assignee: Texas Instruments Incorporated, Dallas, Tex.

[21] Appl. No.: 149,767

[22] Filed: Jan. 29, 1988

[51] Int. Cl.⁵ .................... H03K 17/16; H03K 19/088
[52] U.S. Cl. .................... 307/443; 307/456; 307/458; 307/542; 307/544
[58] Field of Search ............... 307/456, 443, 475, 542, 307/544, 549, 560, 471, 467, 458

[56] References Cited

U.S. PATENT DOCUMENTS

| | | | |
|---|---|---|---|
| 4,321,490 | 3/1982 | Bechdolt | 307/456 |
| 4,330,723 | 5/1982 | Griffith | 307/456 |
| 4,449,063 | 5/1984 | Ohmichi et al. | 307/456 |
| 4,571,503 | 2/1986 | Tobita | 307/491 |
| 4,584,490 | 4/1986 | West | 307/458 |

Primary Examiner—Timothy P. Callahan
Attorney, Agent, or Firm—B. Peter Barndt; Richard L. Donaldson; William E. Hiller

[57] ABSTRACT

Circuitry for actively reducing the effects of ground voltage fluctuations in integrated circuits is described. An input buffer circuit including an output transistor 30 is provided along with a compensation circuit that is designed to reference the base of transistor 30 to an internal ground node of the integrated circuit. The compensation circuit includes a control diode 46, compensation transistors 42 and 43, bias resistors 40, 41 and 45 and diode chain 47, 48 and 49. In operation, the compensation circuit prevents the undesirable switching of output transistor 30 under low input voltage conditions by actively coupling the base of transistor 30 to internal ground through two conducting compensation transistors 43 and 42. Under these conditions, control diode 46 remains reverse biased allowing current flow through diode string 47, 48, and 49 which establish a threshold voltage to set the level at which compensation transistor 43 turns on. Once compensation transistor 43 turns on, a reference voltage is established on the base of transistor 30 which remains at a fixed level above internal ground as determined by the collector to emitter voltages of transistors 42 and 43 in the saturated state. Voltage transients that appear on the internal ground node and the emitter of transistor 30, are coupled to the base of transistor 30 and erroneous switching of this device is prevented. Under high input voltage conditions, diode 46 becomes forward biased and the threshold voltage is not overcome, thereby preventing the switching of transistor 43 and permitting the base of transistor 30 to remain at a high logic level.

14 Claims, 4 Drawing Sheets

METHOD AND CIRCUITRY FOR REDUCING OUTPUT TRANSIENTS RESULTING FROM INTERNAL GROUND INSTABILITIES

BACKGROUND OF THE INVENTION

The present invention relates to electronic circuits and more specifically, to methods and circuitry for preventing undesirable output transients resulting from fluctuations in the internal ground voltage level of said circuits.

Integrated circuits are frequently designed to include a number of outputs which, during operation, will be switched simultaneously. While this type of operation is desirable and necessary in many applications, the switching of multiple outputs causes the injection of significant amounts of current into the internal circuit ground node. In application, this ground node is connected to external ground through standard integrated circuit interconnect and an external package pin which is inherently an inductive element. During dynamic operation, current flows from the internal ground node to external ground through the package pin. The inductive characteristics of this pin cause a corresponding shift in the voltage level on the internal ground node with respect to external voltage levels. As current continues to be injected into the internal ground node, both positive and negative voltage fluctuations will be established as defined by the inductor-voltage equation $V = L \, di/dt$. It is obvious that the greater the number of simultaneously switched output transistors, the greater the instantaneous current injection from internal to external ground and the larger the voltage transients on the internal ground node.

A particular problem is created by the voltage transients described above when the integrated circuit is designed with internal transistors having a base referenced to an external voltage and an emitter referenced to internal ground. Such designs are very common in, for example, input buffers to a variety of integrated circuit device types. In these designs, the internal transistor as described may erroneously turn on when a sufficient fluctuation in the internal ground voltage causes the emitter voltage to separate adequately from the voltage on the base (referenced to external ground). Since the transistor affected typically drives additional circuitry in the output path, the untimely switching of this device will propagate through the intermediate circuitry and result in undesirable signal fluctuations at the device output. Such internal voltage transient behavior will further exacerbate circuit performance as designers strive to obtain even faster switching speeds and increased numbers of outputs.

Accordingly, a need has arisen for a circuit design that will eliminate the deleterious effects of voltage transients on internal ground nodes in integrated circuits. In particular, a need has arisen for controlling the effects of internal ground voltage fluctuations in integrated circuits designed with transistors that have one electrode referenced to internal ground and a control electrode referenced to an external source. Such compensation circuitry should be suitable for use with a variety of integrated circuit designs that suffer from the problems described.

Several techniques have been developed to address these problems. One technique is set forth in application Ser. No. 881,146 filed Jul. 2, 1986, assigned to the assignee of the present invention, wherein a circuit referenced through a capacitor to the supply voltage Vcc is incorporated to control the voltage on the base of the device affected by the internal ground transients. Additional techniques have been developed to control the operation of the compensation network described in the above application. See, for example, application Ser. No. 942,554, filed Dec. 16, 1986 and assigned to the assignee of the present invention. Yet another design to control the operation of the network described in the above application includes two transistors which operate to disable said network in response to the voltage level at the current input. A first transistor may, for example, have its collector coupled to the control side of the above capacitor and its emitter coupled to internal ground. A second transistor may then be used to control the drive current to the first transistor by having a collector couple to the base of the first transistor and an emitter coupled to a node responsive to the input signal. This last technique is the subject matter of co-pending application Ser. No. 07/149,776 assigned to Texas Instruments Incorporated.

Other designs have been implemented to provide a current path between the base of an output transistor and ground to thereby discharge capacitive feedback Miller current generated during circuit switching. See for example, U.S. Pat. No. 4,330,723 or U.S. Pat. No. 4,593,210. These designs, however are not directed to ground transient compensation and lack the high temperature compensation features of the present invention.

Accordingly, it would be desirable to design a ground transient compensation circuit that actively couples the control electrode of the affected device to internal ground which provides tracking of voltage fluctuations with minimal response time. Moreover, it would be desirable to design a ground transient compensation circuit that eliminates the need for a capacitive element, making circuit operation more predictable and greatly reducing circuit layout area. Finally, it is desirable to provide a compensation circuit which has improved voltage margins for operation at elevated temperatures.

SUMMARY OF THE INVENTION

In accordance with the present invention, there is provided a voltage transient compensation circuit that enables accurate tracking of internal circuit ground voltage fluctuations and controls the operation of transistors subject to such fluctuations with minimal response time. Furthermore, there is provided a compensation circuit that requires no capacitive element which results in a design that is easier to model and that requires much less area to lay out in integrated circuit form. Finally, there is provided a compensation circuit that exhibits improved voltage margins at elevated temperatures.

These characteristics are made possible by the present invention wherein a compensation circuit is designed to prevent the erroneous switching of a transistor that has an emitter coupled to an internal ground node, a base referenced to an external grounding source, and a collector that is coupled to the next stage in the circuit's output path. This is accomplished by actively referencing the base of the above transistor to the internal ground voltage through at least one transistor which is conducting when a low voltage is applied to the circuit input. This arrangement will ensure that the base of the protected transistor will track the internal ground voltage when a low voltage is applied to the input. Upon the occurrence of negative transients to the internal ground node, the conducting compensation transistor will force the base of the above transistor to a voltage that is above the internal ground voltage by the compensation transistors collector to emitter voltage in the saturated condition. Since the emitter of the protected transistor follows the internal ground voltage level, this transistor will not turn on and a reliable output is guaranteed.

BRIEF DESCRIPTION OF THE DRAWINGS

Further features and advantages of the present invention will become apparent from the description of the following embodiment, taken in conjunction with the accompanying drawings, in which.

DETAILED DESCRIPTION OF THE PREFERRED EMBODIMENT

Figure 1:
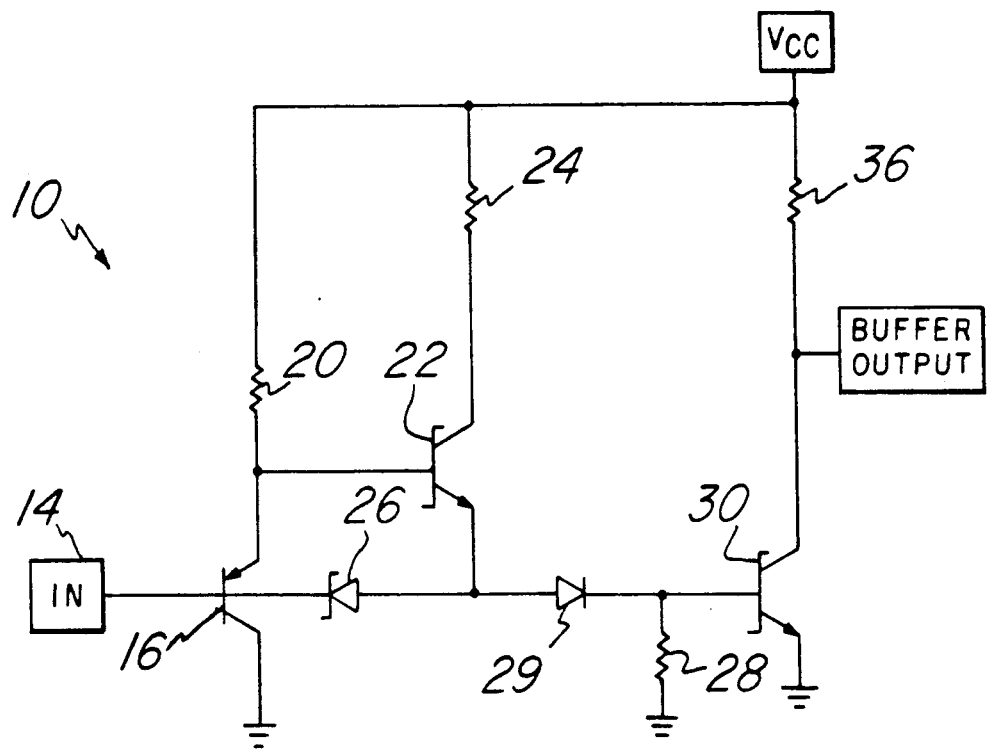
FIG. 1 is a schematic diagram of a representative input buffer circuit which may be subject to the problems solved by the present invention.

Referring first to FIG. 1, there is shown a schematic diagram of a typical bipolar input buffer circuit. Such circuits are often incorporated in the design of a variety of integrated circuit device types. While the operation of this type of design is acceptable under stable internal voltage conditions, transients that may be introduced on the internal ground node can result in output oscillation and overall circuit malfunction. As will be subsequently described, the compensation circuitry of the present invention eliminates the undesirable effect of such transients under certain operating conditions with minimal response time and efficient utilization of circuit layout area.

Referring still to FIG. 1, the input buffer circuit 10 includes an input node 14 for receiving input signals from, for example, an external source. This input is connected to the base of PNP transistor 16 which has a collector connected to the internal circuit ground node and an emitter connected to the base of Schottky clamped transistor 22. The base of transistor 22 is also connected to one terminal of a resistor 20 which has a second terminal connected to a source of supply voltage Vcc. Transistor 22 has an emitter connected to the anode of Schottky diode 26 which also has a cathode connected to the base of transistor 16. The collector of transistor 22 is connected to one terminal of resistor 24 which has a second terminal connected to the supply voltage Vcc. A second diode 29 has an anode connected to both the emitter of transistor 22 and the anode of diode 26 and a cathode connected to the base of Schottky clamped transistor 30. The base of transistor 30 is also connected to one terminal of resistor 28 which has a second terminal connected to the internal ground node. Transistor 30 has an emitter connected to the internal ground node and a collector connected to one terminal of pullup transistor 36 which has a second terminal connected to supply voltage Vcc. The collector of transistor 30 forms the buffer circuit output and is typically connected to additional internal circuitry which ultimately drives the device output buffers. Finally, the internal ground node is connected to an external ground reference potential through conventional interconnects and a device package pin which are not shown.

In normal operation, the above circuit receives an input signal from an external voltage supply which is referenced to external ground potential. Assuming the input node 14 is raised to a logic high level, PNP transistor 16 turns off allowing current through resistor 20 to drive the base electrode of transistor 22. The voltage on the base of transistor 22 will rise and cause transistor 22 to turn on. This action allows current to flow through resistor 24 and transistor 22 which raises the voltage on the cathode of diode 29 causing diode 29 to forward bias and transistor 30 to turn on. Once transistor 30 turns on, current is pulled from external circuitry (not shown) causing the buffer output voltage to drop to a logic low level.

Assuming the voltage applied to the input 14 is a logic low level, PNP transistor 16 will turn on which reduces the voltage on the base of transistor 22 causing it to turn off. With no current flowing into the anode of diode 29, resistor 28 will discharge the base of transistor 30 and turn it off. As a result, the output voltage at the collector of transistor 30 is a logic high level and current is sourced to the buffer output. It can be seen that under low level input conditions the voltage on the anode of diodes 26 and 29 is the input voltage plus the base emitter voltage (Vbe) of transistor 16 minus the base emitter (Vbe) voltage of transistor 22 or approximately the input voltage. In this operating state, the input buffer circuit is sensitive to fluctuations on the internal ground node that may result in oscillations or an erroneous output level at the collector of transistor 30. As mentioned previously, the simultaneous switching of many output transistors causes variations in the voltage level on the internal ground node and, as a result, the emitter electrode of input buffer output transistor 30. When the internal ground node (and transistor 30 emitter) voltage drops with respect to the voltage on the anode of diodes 26 and 29 by a sufficient amount, diode 29 becomes forward biased and transistor 30 turns on. The resulting low voltage on the buffer circuit output (collector of transistor 30) will propagate through the intermediate circuitry and cause an erroneous signal at the output of the integrated circuit.

Figure 2:
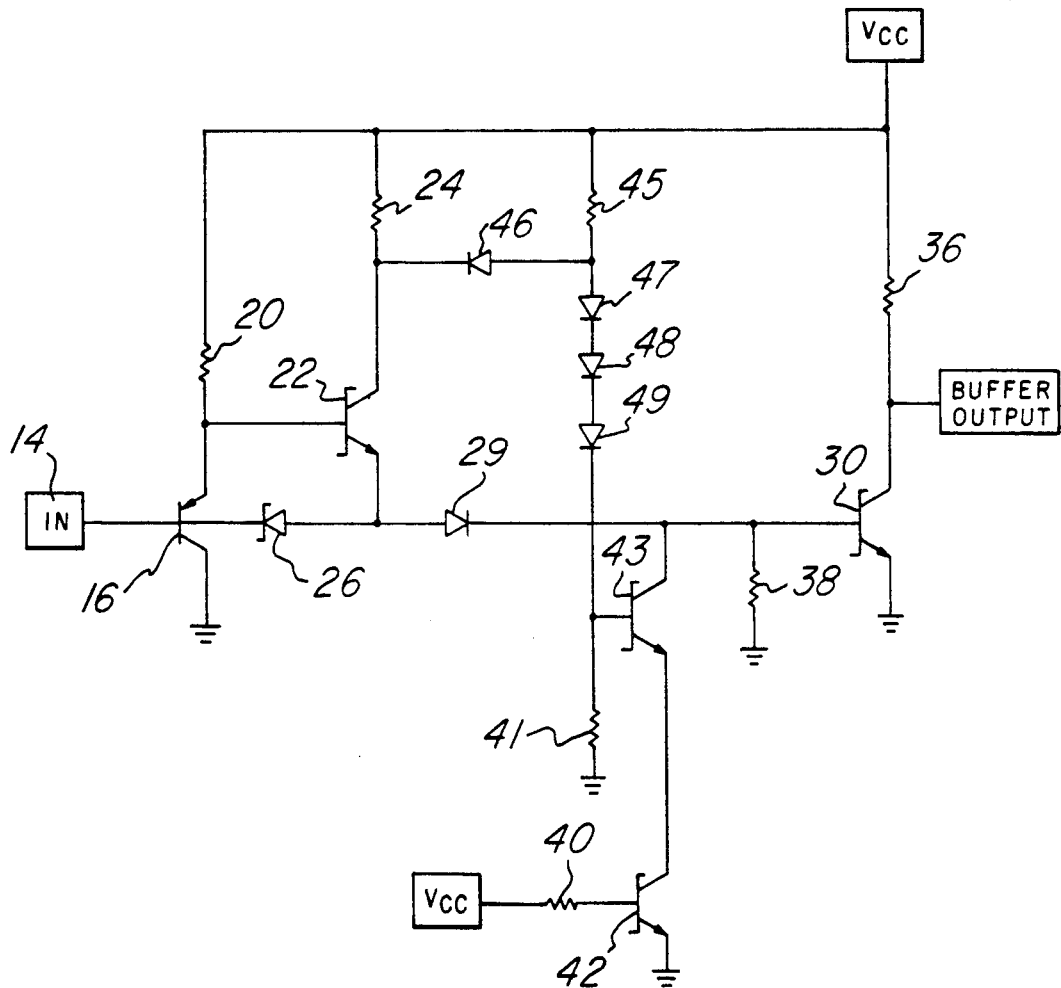
FIG. 2 is a schematic diagram representing a preferred embodiment of the transient compensation circuit of the present invention.

Referring next to FIG. 2, there is shown the representative input buffer circuit of FIG. 1 and the compensation circuitry of the present invention. The elements of the input buffer circuit are provided reference numerals that are the same as those shown in FIG. 1 and the basic operation of these elements is as previously described. The compensation circuitry includes diode 46 which has a cathode connected to the collector of transistor 22 and one end of resistor 24 which has its other terminal connected to the source of supply voltage Vcc. The anode of diode 46 is connected to one terminal of a resistor 45 which has its other terminal connected to the supply voltage Vcc. Resistor 45 may have a resistance of, for example 7K ohms. In addition, the anode of diode 46 is connected to the anode of diode 47 which is the first of a three diode string. The cathode of diode 47 is connected to the anode of diode 48 which in turn has its cathode connected to the anode of diode 49. Diode 49 has a cathode connected to the base of a first compensation transistor 43 and also one terminal of a resistor 41 which has a second terminal connected to the internal ground node. Resistor 41 may have a resistance of, for example, 10K ohms. The collector of transistor 43 is connected to the base of input buffer output transistor 30 and the emitter of transistor 43 is connected to the collector of a second compensation transistor 42. Transistor 42 has an emitter connected to the internal ground node and a base that is connected to one terminal of a resistor 40 having a second terminal connected to the supply voltage Vcc. Resistor 40 may have a resistance of, for example, 25K ohms.

An important feature of the compensation circuitry described above is the added ability to actively reference the base of input buffer output transistor 30 to internal ground instead of the external input voltage during low input operating conditions. Referring still to FIG. 2, when the voltage level at input node 14 is low, transistor 16 turns on which lowers the voltage of the base of transistor 22 causing it to turn off. Since transistor 22 is not conducting, its collector is pulled to a high voltage level by resistor 24 which is attached at one end to the supply voltage Vcc. This action reverse biases diode 46 which allows resistor 45 to supply current through forward biased diodes 47, 48, and 49 to the base of the first compensation transistor 43 turning it on. Diode chain 47, 48 and 49 is provided to set a threshold voltage for the compensation circuitry. The second compensation transistor 42 has its base coupled to the supply voltage Vcc through a resistor 40 and always remains in a conducting state thereby allowing the base of transistor 30 to couple to the internal grounding node through transistors 43 and 42. It can now be seen that, under low input voltage conditions, the base of the buffer output transistor 30 will track the internal ground node voltage at a level that is above internal ground by the collector-emitter (saturated) voltage of transistor 43 plus the collector-emitter (saturated) voltage of transistor 42. As negative fluctuations in the internal ground voltage level are experienced, the voltage level at the base of buffer output transistor 30 will drop accordingly and this transistor will not turn on as may be the case if the base remained referenced to the external input voltage. Therefore, an erroneous low voltage level will not be propagated from the input buffer to the device output circuitry and operating reliability is significantly improved.

It should be noted that an important aspect of the above embodiment is the effect of transistor 42 on high operating temperature performance under worse case low level input conditions. Assuming transistor Vbe's of 0.8 volts at 25 degrees C. and a 1.6 mV per degree C. reduction in Vbe, the worst case (Vin =0.8V) operating margin, at the base of Q22, shifts from 0.8V to 0.48V as the operating temperature is increased from 25 degrees C. to 125 degrees C. with no compensation transistor attached to the base of transistor 30. Further assuming a transistor Vce of approximately 0.25V at both 25 and 125 degrees C., the same operating margin becomes 0.25V (25 degrees C.) and 0.09V (125 degrees C.) for a design which includes only a single compensation transistor coupled to the base of transistor 30. The addition of transistor 42 raises the worst case operating margin to 0.34V at 125 degrees C. It should be clear that this improvement in margin will greatly increase operating reliability in the high temperature regime.

Referring again to FIG. 2, when the voltage level at the input 14 is a high logic level it is desired that input buffer output transistor 30 turn on and remain in that state until the input voltage level returns to a logic low condition. Under these conditions, PNP transistor 16 turns off and transistor 22 turns on thereby causing the voltage level on the collector of transistor 22 to drop to a low logic level. This action will forward bias diode 46 and the current supplied through resistor 45 is diverted from diode string 47, 48, 49 and compensation transistors 43 and 42. Transistor 43 will now remain in a nonconducting state and the current flowing through forward biased diode 46 and conducting transistor 22 will forward bias diode 29 and drive the base of transistor 30 which causes it to remain in the on condition. Under these conditions therefore, the base of the buffer output circuit is allowed to rise with the input voltage level and the desired switching of transistor 30 causes a reliable low voltage at the buffer output.

Figure 3:
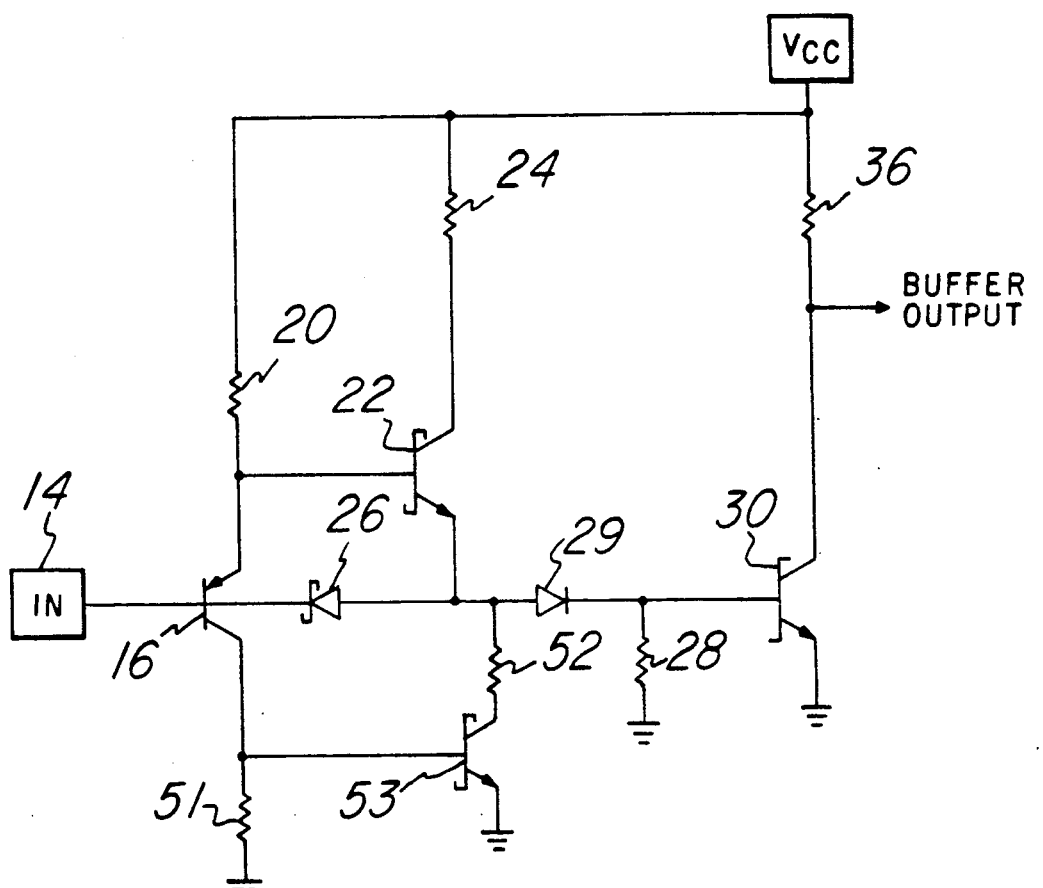
FIG. 3 is a schematic diagram representing an alternative embodiment of the of the transient compensation circuit of the present invention.

Referring now to the schematic of FIG. 3, there is shown another embodiment of the present invention. The basic input buffer circuit of FIGS. 1 and 2 is again reproduced using the prior element identifications for those components that perform the same function. The operation of this circuit and its sensitivity to transient voltage exposure has been described in detail above and will not be repeated.

Still referring to FIG. 3, the transient compensation circuitry includes Schottky clamped transistor 53 having an emitter connected to the internal ground node and a collector connected to one terminal of a resistor 52 which has a second terminal connected to the anode of diode 29. The base terminal of transistor 53 is connected to both the collector of transistor 16 and one terminal of a resistor 51 which has a second terminal connected to ground.

The operation of compensation elements 53, 52 and 51 will now be described in detail. Assuming a low voltage level (logic 0) is applied to the input, transistor 16 turns on and current conducts through resistor 51 to ground. Resistor 51 is ideally sufficiently small such that the voltage drop across it will not cause the turn on of transistor 53. If a voltage transient causes the internal ground voltage to momentarily drop, the voltage on the emitter of transistor 53 will correspondingly drop. Assuming that the input and supply voltages do not change, this emitter voltage level decrease occurs faster than any decrease in voltage level on the base of transistor 53 because of two capacitive coupling effects. The junction capacitance of transistor 16 couples the base of transistor 53 to the input voltage and, in addition, the junction capacitance of resistor 51 to a tank that is biased to the supply voltage couples the base of transistor 53 to the supply voltage As a result of the discharge time associated with these capacitances, the base of transistor 53 will fall at a slower rate than that of the emitter which allows a sufficient base to emitter voltage differential to turn on transistor 53.

Once transistor 53 turns on, the voltage on the anode of diodes 26 and 29 will be clamped to a level that is offset from internal ground by a fixed amount approximately equal to the collector to emitter voltage (Vce) of transistor 53 and insufficient to forward bias diode 29. As long as transistor 53 remains on, the voltage on the anode of diode 29 will track any movement in the internal ground voltage level and transistor 30 will remain off. This results in a proper high level output signal from the input buffer. When the internal ground voltage returns to approximately zero volts, transistor 53 turns off which allows the voltage level on the anode of diode 29 to be controlled by the input.

Figure 4:
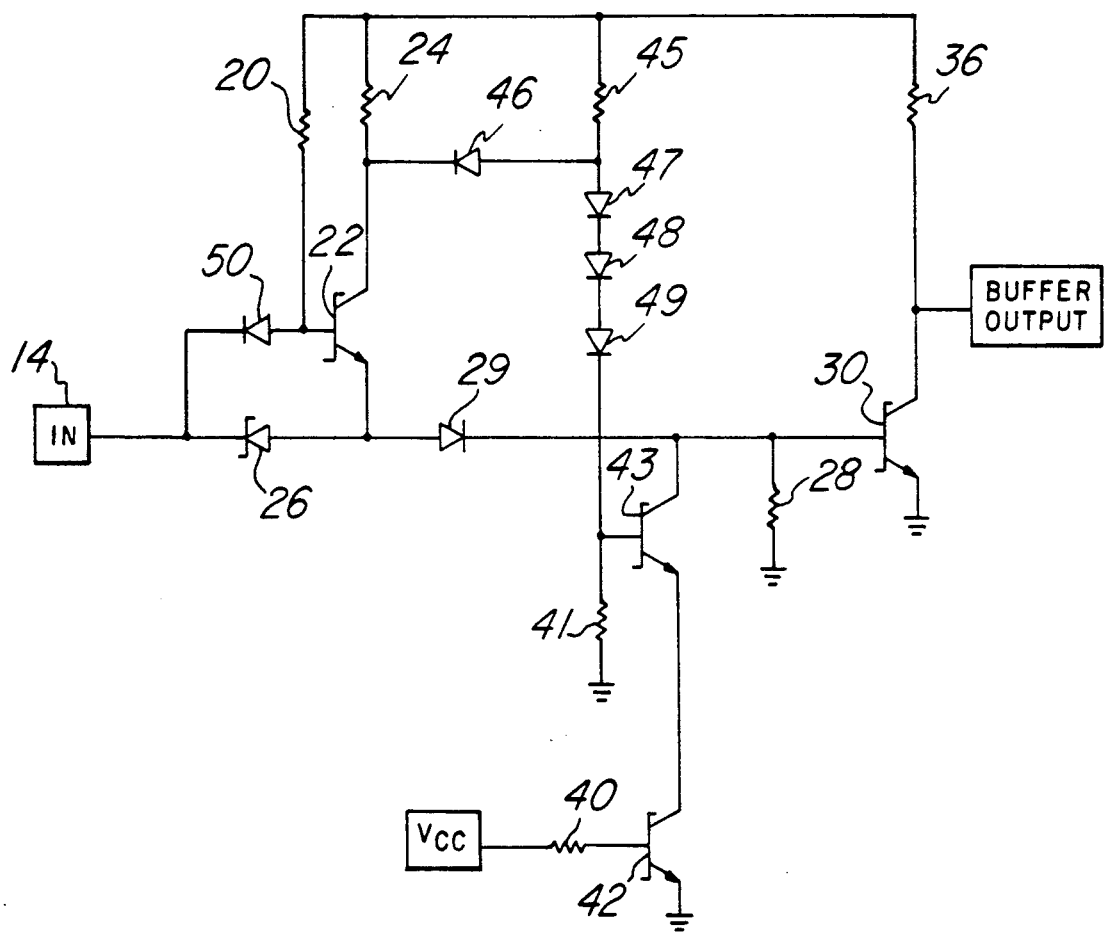
FIG. 4 is a schematic diagram representing a second alternative embodiment of the transient compensation circuit of the present invention.

Referring now to the schematic of FIG. 4, there is shown another embodiment of the present invention. This design is similar to the input buffer circuit of FIG. 2 except that the input transistor 16 of FIG. 2 is replaced by a diode input structure. As shown in FIG. 4, diode 50 has a cathode connected to input node 14 and an anode connected to the base of transistor 22. Other than diode 50 the remaining elements of the buffer circuit remain the same as those shown in the design of FIG. 2 and they are referenced accordingly. The compensation circuitry, including resistors 40, 41, 45, diodes 46, 47, 48, 49, and transistors 42 and 43, are connected in the same manner as shown in the embodiment of FIG. 2.

Assuming that a logic low voltage level is applied to the input node 14 of FIG. 3, diode 50 will conduct current supplied through resistor 20. As a result of this diversion of current from the base of transistor 22, this transistor will turn off and allow diode 46 to reverse bias. This action permits the diode chain 47, 48, and 49 to forward bias and provide current through resistor 45 to drive the base of transistor 43, turning it on. As described in the case of the FIG. 2, with transistor 43 and 42 conducting, the base of buffer output transistor 30 will remain two Vce sat's (collector to emitter voltage saturated) above the internal ground node which enables the base of this device to track fluctuations in emitter voltage and remain in the off condition. This condition ensures a stable device output.

When a logic high voltage level is applied to the input node 14, diode 50 will remain reverse biased and the base of 22 is driven by current supplied through resistor 20. With transistor 22 conducting, diode 46 becomes forward biased and current is diverted from diodes 47, 48, 49 which prevents the turn on of transistor 43. Diode 29 becomes forward biased and the base of transistor 30 is taken to a logic high level turning it on. The desired low level at the output (collector of transistor 30) is the result of these operating conditions.

The present invention therefore provides a circuit design that establishes an internal reference voltage that tracks the internal circuit ground node and prevents undesirable circuit switching which results from fluctuations in the internal ground voltage. This is accomplished with greatly improved response time by providing active transistors to establish the desired reference potential. It should be understood that the present invention is not limited to TTL input structures of even to bipolar transistors. The present invention may be used in a broad variety of circuit designs where a threshold voltage which may be subject to undesirable and unpredictable voltage fluctuations is required.

The present invention is particularly useful with input circuit designs in integrated circuits having large numbers of high current output devices that may be simultaneously switched during dynamic operation resulting in current injection at the internal ground node and a corresponding fluctuation in the ground voltage level.

Having described the invention in connection with certain specific embodiments thereof, it is to be understood that further modifications may now suggest themselves to those skilled in the art and it is intended to cover such modifications as fall within the scope of the appended claims.

I claim:

1. A compensating circuit for controlling the effects of voltage changes on a reference node comprising:
   an output switching device having a first control terminal for receiving an input signal and a first output terminal for providing an output signal in response to said input signal;
   a first transistor having a first reference terminal coupled to said reference node and a second control terminal coupled to a source of supply voltage for establishing a first reference voltage on a second output terminal of said first transistor; and
   a second transistor having a second reference terminal coupled to said second output terminal, a third output terminal coupled to said first control terminal and a third control terminal coupled to a control circuit, said control circuit responsive to said input signal to establish a second reference voltage on said first control terminal when said input signal is at a selected voltage which prevents the switching of said output switching device.

2. A circuit as recited in claim 1, wherein said output switching device is a bipolar transistor.

3. A circuit as recited in claim 1, wherein said selected voltage is a logic low voltage level.

4. A circuit as recited in claim 1 wherein said control circuit includes:
   at least one diode connected between said third control terminal and said source of supply voltage for providing current and setting a threshold voltage to control the switching of said second transistor; and
   a control device coupled to said at lest one diode and responsive to said input signal for controlling said current.

5. A circuit as recited in claim 4, wherein said control device is a diode coupled at one end to said at least one diode and coupled at a second end to a circuit node that is responsive to said input signal.

6. A circuit as recited in claim 4, wherein said at least one diode comprises three diodes connected in series coupled at one end to said third control terminal and coupled at a second end to said control device to thereby adjust the voltage level at which said second transistor is rendered conductive.

7. A compensating circuit for controlling the effects of voltage variations on a reference node of an input circuit comprising:
   a circuit having said reference node and further including an output switching device having a control electrode for receiving an input signal and an output electrode for providing an output in response to said input signal; and
   a compensation transistor having a reference terminal coupled to said reference node, a control terminal coupled to a circuit node responsive to said input signal and an output terminal coupled to said control electrode for controlling switching of said output switching device when said input signal is at a selected level;
   wherein said referenced terminal is coupled to said reference node through a bias transistor to actively reference said control electrode to said reference node.

8. A circuit as recited in claim 7, wherein said selected level is a logic low level.

9. A circuit as recited in claim 7, wherein said compensation transistor is a bipolar transistor and said reference terminal, control terminal, and output terminal are respectively and emitter, base and collector.

10. In an integrated circuit, a circuit for controlling the effects of transients on an internal reference node comprising:
   an input circuit including an output switching transistor for receiving an input signal and producing an output signal in response to said input signal;
   at least one compensation transistor having a first parasitic capacitance and a first collector coupled to a first control electrode of said switching transistor through a resistor in series with a diode, a first emitter coupled to said reference node and a base coupled to a second collector of an input transistor having a second parasitic capacitance and a second control electrode coupled to said input signal and a reference electrode coupled to said supply voltage; and
   means for coupling said first control electrode to said reference node in response to variations in voltage on said reference node, said coupling means coupled between said base of said compensation transistor, said second collector of said input transistor and said reference node.

11. A circuit as recited in claim 10, wherein said collector is coupled to said control electrode through a resistor in series with a diode.

12. A circuit as recited in claim 10 wherein said coupling means includes;
   a bias resistor connected between said base of said compensation transistor and said internal reference node, said bias resistor coupling with said first and said second parasitic capacitance and forming a resistive-capacitive network to delay a reduction in voltage on said base with respect to that on said internal reference node to ensure the switching of said compensation transistor in the presence of negative transients on said internal reference node.

13. A method of controlling transient voltage levels on an internal ground node in an integrated circuit comprising the steps of:
   applying an input signal to an input circuit, said input circuit having an output device coupled to said internal ground node for providing an output signal in response to said input signal;
   providing a first reference voltage on a base terminal of a compensation transistor, said first reference voltage offset from the voltage level on said internal ground node by a predetermined amount, said compensation transistor having an output terminal coupled to a control electrode of said output device and an emitter coupled to said internal ground node; and
   providing a second reference voltage on said output terminal, said second reference voltage offset from said first reference voltage and varying faster than said first reference voltage in response to said transient voltage levels such that said output device remains nonconductive when said input signal is at a selected level.

14. A method as recited in claim 13, wherein said selected level is a logic low level voltage.

* * * * *